US010298019B1

(12) United States Patent
Wang et al.

(10) Patent No.: US 10,298,019 B1
(45) Date of Patent: May 21, 2019

(54) COMMUNICATION HOST AND PHOTOVOLTAIC POWER GENERATION SYSTEM (71) Applicant: SUNGROW POWER SUPPLY CO., LTD., Anhui (CN)

(72) Inventors: Xinyu Wang, Anhui (CN); Yanfei Yu, Anhui (CN); Yu Gu, Anhui (CN); Jun Xu, Anhui (CN); Yilei Gu, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 0 days.

(21) Appl. No.: 16/108,872

(22) Filed: Aug. 22, 2018

(30) Foreign Application Priority Data

Oct. 26, 2017 (CN) .............................. 2017 1 014596

(51) Int. Cl.
H02J 3/38 (2006.01)
H02S 40/34 (2014.01)
H01L 31/042 (2014.01)

(52) U.S. Cl.
CPC ............ H02J 3/385 (2013.01); H01L 31/042 (2013.01); H02S 40/34 (2014.12); Y02E 10/56 (2013.01)

(58) Field of Classification Search
CPC ........ H02J 3/385; H01L 31/042; H02S 40/34; Y02E 10/56
See application file for complete search history.

(56) References Cited

U.S. PATENT DOCUMENTS 9,819,182 B1 * 11/2017 Batten ........................ H02J 1/08
2014/0183960 A1 * 7/2014 Balachandreswaran ....................
H01L 31/042
307/82

* cited by examiner

Primary Examiner — Daniel J Cavallari
(74) Attorney, Agent, or Firm — Harness, Dickey & Pierce, P.L.C.

(57) ABSTRACT

A communication host and a photovoltaic power generation system are provided. The communication host includes an acquiring module, a determining module and a control module. The acquiring module is configured to acquire an operating state parameter of the system. The determining module is configured to determine whether the optimizer meets a first preset triggering condition based on the operating state parameter. In a case where the optimizer meets the first preset triggering condition, a first triggering instruction is transmitted, to instruct the system to decrease, in response to the first triggering instruction, the direct current bus voltage of the grid-connected inverter, and/or a second triggering instruction is transmitted, to instruct the system to increase, in response to the second triggering instruction, an output voltage limiting value of at least one of the optimizers meeting the first preset triggering condition.

10 Claims, 3 Drawing Sheets

COMMUNICATION HOST AND PHOTOVOLTAIC POWER GENERATION SYSTEM

CROSS REFERENCE TO RELATED APPLICATION

The present application claims priority to Chinese Patent Application No. 201711014596.0, titled "COMMUNICATION HOST AND PHOTOVOLTAIC POWER GENERATION SYSTEM", filed on Oct. 26, 2017 with the State Intellectual Property Office of People's Republic of China, which is incorporated herein by reference in its entirety.

FIELD

The present disclosure relates to the technical field of photovoltaic power generation, and in particular to a communication host and a photovoltaic power generation system.

BACKGROUND

With the continuous development of science and technology, photovoltaic power generation systems are developed rapidly. Generally, in a current photovoltaic power generation system, multiple photovoltaic modules are connected in series to form a photovoltaic string, and photovoltaic strings are connected in parallel to form a photovoltaic array. An inverter converts a direct current (DC) into an alternating current (AC) by performing maximum power point tracking (MPPT) control on the photovoltaic string or the photovoltaic array, and transmits the AC to the power grid.

For conventional photovoltaic power generation systems, a centralized photovoltaic power generation system usually performs MPPT on only one path, and both a string-type photovoltaic power generation system and a distributed photovoltaic power generation system perform MPPT on multiple paths. However, series mismatch and parallel mismatch among modules may be caused due to factors such as shadow occlusion and differences between module parameters, thereby resulting in a loss in a power generation capacity.

Figure 1:
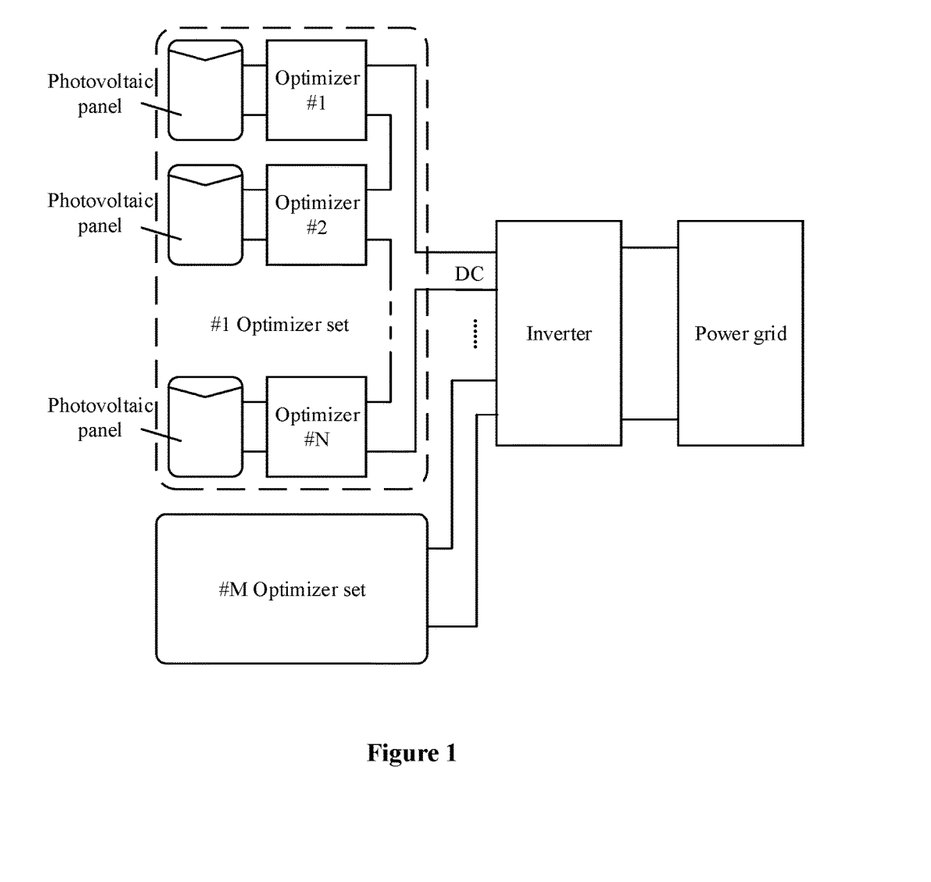
FIG. 1 is a schematic structural diagram of a photovoltaic power generation system according to an embodiment of the present disclosure.

At present, in order to solve the series mismatch and parallel mismatch among the photovoltaic modules, each of the photovoltaic modules is generally provided with an optimizer having a module-level MPPT function. As shown in FIG. 1, multiple optimizers are connected in series to form an optimizer set, and multiple optimizer sets are connected in parallel to a DC input terminal of a grid-connected inverter.

However, it is found by the inventor that with the optimizers having such structure, in order to ensure that the inverter operates in an optimal operating range, the DC bus voltage of the grid-connected inverter is usually controlled to be a constant value. In a case where there is a great difference between maximum powers of photovoltaic panels in the same optimizer set (in a case where the photovoltaic panels are uniformly shielded by leaves, dark clouds and the like), the maximum power generation capacity of the system cannot be achieved with the conventional solution.

Therefore, a technical issue to be solved urgently by those skilled in the art is to provide a photovoltaic power generation system, such that the maximum power generation capacity of the photovoltaic power generation system can be achieved.

SUMMARY

In view of the above, a communication host and a photovoltaic power generation system are provided according to the embodiments of the present disclosure, so as to acquire the maximum power of the photovoltaic power generation system.

The following technical solutions are provided according to the embodiments of the present disclosure.

A communication host is provided, which is applied to a photovoltaic power generation system. The photovoltaic power generation system includes photovoltaic strings and optimizers. Each of the photovoltaic strings includes at least one photovoltaic module. Each of the optimizers is connected in parallel with at least one of the photovoltaic strings. Output terminals of multiple optimizers in the optimizers are connected in series to form an optimizer set. An output terminal of the optimizer set is connected to a direct current input terminal of a grid-connected inverter. The communication host includes an acquiring module, a determining module and a control module.

The acquiring module is configured to acquire an operating state parameter of the photovoltaic power generation system. The operating state parameter includes at least one or more of the following parameters: an output voltage of the optimizer, an operating state of the optimizer, an input current of the grid-connected inverter and an input power of the grid-connected inverter.

The determining module is configured to determine, based on the operating state parameter, whether the optimizer meets a first preset triggering condition.

The control module is configured to perform at least one of the following operations: transmitting, in a case where the optimizer meets the first preset triggering condition, a first triggering instruction for decreasing a DC bus voltage, to instruct the photovoltaic power generation system to decrease, in response to the first triggering instruction, the DC bus voltage of the grid-connected inverter in the photovoltaic power generation system; and transmitting, in a case where the optimizer meets the first preset triggering condition, a second triggering instruction for adjusting an output voltage limiting value of the optimizer, to instruct the photovoltaic power generation system to increase, in response to the second triggering instruction, an output voltage limiting value of at least one of the optimizers meeting the first preset triggering condition.

In an embodiment, the first preset triggering condition includes at least one of:

a condition that an output voltage of at least one of the optimizers is greater than or equal to a first output voltage limiting value;

a condition that at least one of the optimizers is in a power-limited operating state;

a condition that at least a difference between two input currents of the grid-connected inverter is greater than a first preset current threshold; and a condition that at least a difference between two input powers of the grid-connected inverter is greater than or equal to a first preset power threshold.

In an embodiment, the communication host may further include a communication module. The communication module is arranged between the communication host and the optimizer and is configured to perform data communication between the optimizer and the communication host.

In an embodiment, the control module is further configured to perform at least one of the following operations:

transmitting, in a case where the optimizer meets a second preset triggering condition, a third triggering instruction for increasing a direct current bus voltage, to instruct the photovoltaic power generation system to increase, in response to the third triggering instruction, the direct current bus voltage of the grid-connected inverter in the photovoltaic power generation system, and transmitting, in a case where the optimizer meets the second preset triggering condition, a fourth triggering instruction for adjusting the output voltage limiting value of the optimizer, to instruct the photovoltaic power generation system to decrease, in response to the fourth triggering instruction, an output voltage limiting value of at least one of the optimizers meeting the second preset triggering condition.

In an embodiment, the second preset triggering condition includes at least one of:
a condition that an output voltage of at least one of the optimizers is smaller than a second output voltage limiting value;
a condition that at least one of the optimizers is in a released power-limited operating state;
a condition that at least a difference between two input currents of the grid-connected inverter is less than a second preset current threshold; and
a condition that at least a difference between two input powers of the grid-connected inverter is smaller than the second preset power threshold.

A photovoltaic power generation system is further provided, which includes photovoltaic strings, optimizers and a communication host.

Each of the photovoltaic strings includes at least one photovoltaic module. Each of the optimizers is connected in parallel with at least one of the photovoltaic strings. Output terminals of multiple optimizers in the optimizers are connected in series to form an optimizer set. An output terminal of the optimizer set is connected to a DC input terminal of a grid-connected inverter. The communication host includes an acquiring module, a determining module and a control module.

The acquiring module is configured to acquire an operating state parameter of the photovoltaic power generation system. The operating state parameter includes at least one or more of the following parameters: an output voltage of the optimizer, an operating state of the optimizer, an input current of the grid-connected inverter and an input power of the grid-connected inverter.

The determining module is configured to determine, based on the operating state parameter, whether the optimizer meets a first preset triggering condition.

The control module is configured to perform at least one of the following operations:
transmitting, in a case where the optimizer meets the first preset triggering condition, a first triggering instruction for decreasing a direct current bus voltage, to instruct the photovoltaic power generation system to decrease, in response to the first triggering instruction, the direct current bus voltage of the grid-connected inverter in the photovoltaic power generation system, and transmitting, in a case where the optimizer meets the first preset triggering condition, a second triggering instruction for adjusting an output voltage limiting value of the optimizer, to instruct the photovoltaic power generation system to increase, in response to the second triggering instruction, an output voltage limiting value of at least one of the optimizers meeting the first preset triggering condition.

In an embodiment, the first preset triggering condition includes at least one of:
a condition that an output voltage of at least one of the optimizers is greater than or equal to a first output voltage limiting value;
a condition that at least one of the optimizers is in a power-limited operating state;
a condition that at least a difference between two input currents of the grid-connected inverter is greater than a first preset current threshold; and
a condition that at least a difference between two input powers of the grid-connected inverter is greater than or equal to a first preset power threshold.

In an embodiment, the communication host may further include a communication module. The communication module is arranged between the communication host and the optimizer and is configured to perform data communication between the optimizer and the communication host.

In an embodiment, the control module is further configured to perform at least one of the following operations:
transmitting, in a case where the optimizer meets a second preset triggering condition, a third triggering instruction for increasing a direct current bus voltage, to instruct the photovoltaic power generation system to increase, in response to the third triggering instruction, the direct current bus voltage of the grid-connected inverter in the photovoltaic power generation system, and transmitting, in a case where the optimizer meets the second preset triggering condition, a fourth triggering instruction for adjusting the output voltage limiting value of the optimizer, to instruct the photovoltaic power generation system to decrease, in response to the fourth triggering instruction, an output voltage limiting value of at least one of the optimizers meeting the second preset triggering condition.

In an embodiment, the second preset triggering condition includes at least one of:
a condition that an output voltage of at least one of the optimizers is smaller than a second output voltage limiting value;
a condition that at least one of the optimizers is in a released power-limited operating state;
a condition that at least a difference between two input currents of the grid-connected inverter is less than a second preset current threshold; and
a condition that at least a difference between two input powers of the grid-connected inverter is smaller than the second preset power threshold.

Based on the above technical solution, a communication host is provided, which is applied to a photovoltaic power generation system. The photovoltaic power generation system includes photovoltaic strings and optimizers. The photovoltaic string includes at least one photovoltaic module. The optimizer is connected in parallel with at least one of the photovoltaic strings. Output terminals of multiple optimizers are connected in series to form an optimizer set. Output terminals of multiple optimizer sets are connected to a DC input terminal of a grid-connected inverter. The communication host includes an acquiring module, a determining module and a control module. The acquiring module is configured to acquire an operating state parameter of the photovoltaic power generation system. The determining module is configured to determine, based on the operating state parameter, whether the optimizer meets a first preset triggering condition. The control module is configured to: transmit, in a case where the optimizer meets the first preset triggering condition, a first triggering instruction for decreasing a DC bus voltage, to instruct the photovoltaic power generation system to decrease, in response to the first triggering instruction, the DC bus voltage of the grid-connected inverter in the photovoltaic power generation system; and/or transmit, in a case where the optimizer meets the first preset triggering condition, a second triggering instruction for adjusting an output voltage limiting value of the optimizer, to instruct the photovoltaic power generation system to increase, in response to the second triggering instruction, an output voltage limiting value of at least one of the optimizers meeting the first preset triggering condition. It can be seen from the solution that, the DC bus voltage or the output voltage limiting value of the optimizer is adjusted, thereby achieving a maximum power generation capacity of the photovoltaic power generation system.

BRIEF DESCRIPTION OF THE DRAWINGS

In order to more clearly describe the technical solution in the embodiments of the present disclosure or the technical solution in the conventional technology, drawings to be used in the embodiments of the present disclosure or in the conventional technology are briefly described hereinafter. It is apparent that the drawings described below show merely the embodiments of the present disclosure, and those skilled in the art may obtain other drawings according to the provided drawings without any creative effort.

DETAILED DESCRIPTION OF EMBODIMENTS

In conjunction with the background and FIG. 1, in the conventional technology, an optimizer performs MPPT control on a photovoltaic module connected to the optimizer, and all optimizers in the same optimizer set have the same output current. Therefore, a ratio of output powers of any two optimizers in the same optimizer set is equal to a ratio of output voltages of the two optimizers. That is, an optimizer with a large output power also has a large output voltage.

For example, it is assumed that each of optimizer sets in the photovoltaic power generation system in FIG. 1 includes 22 optimizers connected in series, and the photovoltaic power generation system is a 1 kV photovoltaic power generation system. That is, an output voltage (which is equal to the DC bus voltage of the inverter) of each of the optimizer sets in the photovoltaic power generation system is required to be smaller than 1 kV. Therefore, in order to ensure that output voltages of the 22 optimizers are all smaller than 1 kV, it is required to set an output voltage limiting value for each of optimizers in advance. For example, the output voltage limiting value of the optimizer is set to be 43V (in this case, 43V*22=946V<1000V).

Figure 2:
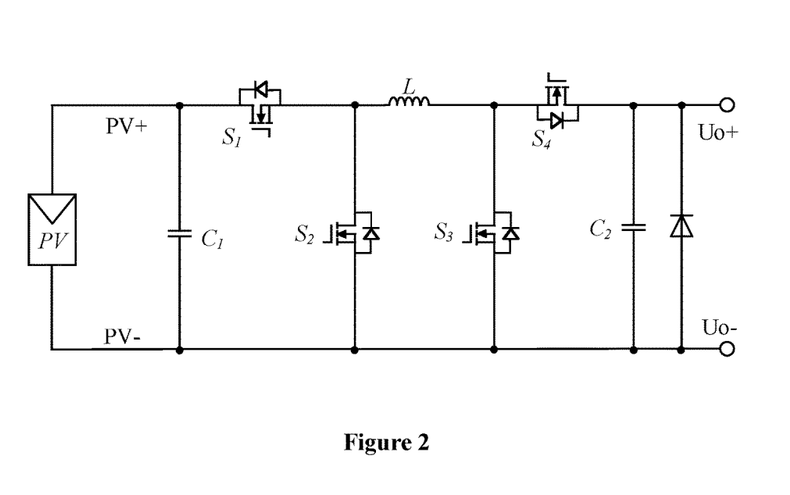
FIG. 2 is a schematic structural diagram of an optimizer of a photovoltaic power generation system according to an embodiment of the present disclosure.

Specifically, in the embodiment, the optimizer may be a buck-boost circuit-based optimizer as shown in FIG. 2. It is to be noted that, in order to ensure that the inverter operates in an optimal state, the DC bus voltage of the inverter is generally controlled to be constant. For example, the DC bus voltage of the inverter is controlled to be a constant of 800V.

Based on the above, it is assumed that the maximum output power of a photovoltaic string corresponding to 11 optimizers in an optimizer set is 200 W, and the output power of a photovoltaic string corresponding to the other 11 optimizers in the optimizer set is only 100 W due to a factor such as shielding. For ease of calculation, it is assumed that the optimizers corresponding to the same string have the same conversion efficiency, the following results may be obtained.

(1) The maximum power of the optimizer set (for ease of calculation, it is assumed that efficiency of the optimizer is 100%) is calculated as (200 W+100 W)×11=3300 W.

(2) According to the rule that a power ratio is equal to a voltage ratio, a ratio of the output voltages of the optimizers respectively corresponding to the above two photovoltaic strings is 2:1 in a case where the photovoltaic strings both output the maximum power.

(3) Based on the condition that the DC bus voltage is a constant of 800V, the following results may be obtained: an output voltage of the optimizer corresponding to the photovoltaic string with the maximum output power of 200 W is 48.5V, and an output voltage of the optimizer corresponding to the photovoltaic string with the maximum power of 100 W is 24.2V.

(4) Since the maximum output voltage limiting value of the optimizer is set to be 43V, the output voltage of 48.5V of the optimizer corresponding to the photovoltaic string with the maximum output power of 200 W exceeds the output voltage limiting value.

(5) Therefore, based on the limit condition that the maximum output voltage limiting value is 43V, it may be determined that the output voltage of the optimizer corresponding to the photovoltaic string with the maximum output power of 200 W is 43V. In this case, the output voltage of the optimizer corresponding to the photovoltaic string with the maximum power of 100 W may be calculated as (800V−11×43V)/11=29.7V.

(6) Based on the rule that the ratio of output voltages is equal to the ratio of powers in the optimizer, it may be determined that an actual output power of the optimizer corresponding to the photovoltaic string with the maximum output power of 200 W is calculated as 43V/29.7V×100 W=144.8 W. That is, the optimizer corresponding to the photovoltaic string with the maximum output power of 200 W operates in the power-limited state (the actual output power of 144.8 W is smaller than a theoretical output power of 200 W). In this case, a total output power of the optimizer set is calculated as (144.8 W+100 W)×11=2692.8 W, which is only 81.6% of the theoretical maximum power of 3300 W.

Figure 3:
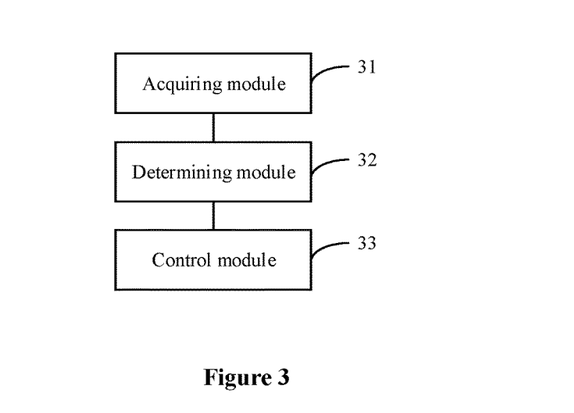
FIG. 3 is a schematic structural diagram of a photovoltaic power generation system according to another embodiment of the present disclosure.

It can be seen that in the conventional technology, in a case that there is a large difference between the maximum output powers of the photovoltaic strings in the same optimizer set, not all the photovoltaic panels in the same optimizer set can output a maximum power. In view of this, a communication host is provided in the embodiment. As shown in FIG. 3, the communication host is applied to a photovoltaic power generation system. The photovoltaic power generation system includes a photovoltaic string and an optimizer. The photovoltaic string includes at least one photovoltaic module. The optimizer is connected in parallel with at least one of the photovoltaic strings. Output terminals of the multiple optimizers are connected in series to form an optimizer set. An output terminal of the optimizer set is connected to a DC input terminal of a grid-connected inverter. The communication host includes an acquiring module 31, a determining module 32 and a control module 33.

The acquiring module 31 is configured to acquire an operating state parameter of the photovoltaic power generation system.

The operating state parameter includes at least one or more of the following parameters: an output voltage of the optimizer, an operating state of the optimizer, an input current of the grid-connected inverter and an input power of the grid-connected inverter. In addition, the operating state parameter of the photovoltaic power generation system may further include an input current of the optimizer, an input voltage of the optimizer and a temperature and so on.

The determining module 32 is configured to determine, based on the operating state parameter, whether the optimizer meets a first preset triggering condition.

The first preset triggering condition may include at least one of:
   an output voltage of at least one of the optimizers is greater than or equal to a first output voltage limiting value;
   at least one of the optimizers is in a power-limited operating state;
   at least a difference between two input currents of the grid-connected inverter is greater than a first preset current threshold; and
   at least a difference between two input powers of the grid-connected inverter is greater than or equal to a first preset power threshold.

It is to be noted that the first preset triggering condition may be any one of the above conditions, or may be a combination of any number of the above conditions. For example, the first preset triggering condition may be that output voltages of a preset number of optimizers in the same optimizer set are greater than or equal to the first output voltage limiting value, or that a preset number of optimizers are in the power-limited operating state. Alternatively, the first preset triggering condition may also be that an adjustment operation is triggered in the photovoltaic power generation system in a case where a difference between input powers or input currents of the same grid-connected inverter is greater than a preset value.

It may be determined whether the optimizer is in the power-limited operating state based on the acquired parameters of the optimizer such as an input current, an input voltage, an output current, an output voltage, an input power, an output power and a temperature. The present disclosure is not limited to the method of determining whether the optimizer is in the power-limited operating state based on the output voltage of the optimizer, as long as a state of the optimizer can be obtained based on the acquired parameter.

In an example, output currents of any two optimizers in the same optimizer set may be acquired. In a case where a difference between the output currents of the two optimizers meets a preset condition, it is determined that the optimizer with a low output current is in the power-limited operating state. In another example, an output voltage of each of the optimizers may be acquired. In a case where the output voltage of the optimizer exceeds the first output voltage limiting value, it is determined that the optimizer is required to be adjusted. It is to be noted that the first output voltage limiting value may be set according to actual needs. Preferably, the first output voltage limiting value is set to be a value smaller than the maximum output voltage limiting value of 43V. For example, the first output voltage limiting value is set to be 42V. In this case, if the acquired output voltage of the optimizer reaches 42V, a control request may be transmitted to the communication host.

The control module 33 is configured to: transmit, in a case where the optimizer meets the first preset triggering condition, a first triggering instruction for decreasing a DC bus voltage, to instruct the photovoltaic power generation system to decrease, in response to the first triggering instruction, the DC bus voltage of the grid-connected inverter in the photovoltaic power generation system; and/or transmit, in a case where the optimizer meets the first preset triggering condition, a second triggering instruction for adjusting an output voltage limiting value of the optimizer, to instruct the photovoltaic power generation system to increase, in response to the second triggering instruction, an output voltage limiting value of at least one of the optimizers meeting the first preset triggering condition.

It can be seen that a method for controlling a photovoltaic power generation system is provided. With the method, the DC bus voltage is decreased and the output voltage limiting value of the optimizer is adjusted, thereby solving a problem that there is a large difference between a maximum power obtained by a conventional method and a theoretical maximum power.

Figure 4:
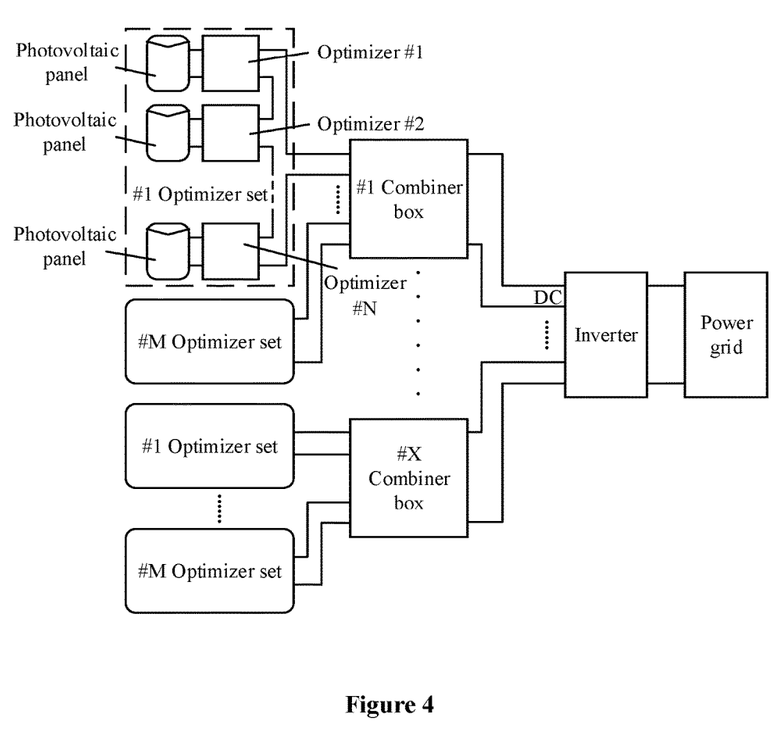
FIG. 4 is a schematic structural diagram of a photovoltaic power generation system according to another embodiment of the present disclosure.

It is to be noted that in a case where the photovoltaic power generation system does not include a combiner box, as shown in FIG. 1, an input current or an input power of the grid-connected inverter indicates an output current or an output power of each optimizer set. In a case where the photovoltaic power generation system includes a combiner box, as shown in FIG. 4, the input current or the input power of the grid-connected inverter system indicates the output current or the output power of the combiner box.

Optionally, based on the above embodiment, the communication host according to the embodiment further includes a communication module. The communication module is arranged between the communication host and the optimizer, and is configured to perform data communication between the optimizer and the communication host.

In addition, the control module is further configured to: transmit, in a case where the optimizer meets a second preset triggering condition, a third triggering instruction for increasing a direct current bus voltage, to instruct the photovoltaic power generation system to increase, in response to the third triggering instruction, the direct current bus voltage of the grid-connected inverter in the photovoltaic power generation system; and/or transmit, in a case where the optimizer meets the second preset triggering condition, a fourth triggering instruction for adjusting the output voltage limiting value of the optimizer, to instruct the photovoltaic power generation system to decrease, in response to the fourth triggering instruction, an output voltage limiting value of at least one of the optimizers meeting the second preset triggering condition.

Optionally, the second preset triggering condition includes at least one of:
   a condition that an output voltage of at least one of the optimizers is smaller than a second output voltage limiting value;
   a condition that at least one of the optimizers is in a released power-limited operating state;

a condition that at least a difference between two input currents of the grid-connected inverter is less than a second preset current threshold; and a condition that at least a difference between two input powers of the grid-connected inverter is smaller than the second preset power threshold.

It can be seen in the embodiment that, the second preset triggering condition is opposite to the first preset triggering condition. The first preset triggering condition is used to trigger the communication host to adjust the DC bus voltage and the output voltage limiting value of the optimizer to maximize the output power of the optimizer. However, in a case where the communication host detects that the output power of the optimizer is normal, the communication host controls the optimizer to return back to the DC bus voltage or the output voltage limiting value of the optimizer.

It is to be noted that, in the embodiment, since the optimizers in the same optimizer set operate in different power generation states, there may be a case that some of the optimizers in the optimizer set are adjusted at the same time, and there may also be a case that in the photovoltaic power generation system, output voltage limiting values of some of the optimizers are increased while output voltage limiting values of some of the optimizers are decreased. The adjusting standard on an optimizer is not limited as long as the above triggering conditions are met.

The principle of the photovoltaic power generation system according to the embodiment of the present disclosure is described with specific examples hereinafter.

In a first scheme, the power is increased by increasing the output voltage limiting value of the optimizer. For example, the output voltage limiting value of the optimizer in the above embodiment is adjusted from 43V to 50V. Since 48.5V<50V, the optimizer meets the maximum power output requirement.

It is to be noted that the output voltage limiting value of the optimizer may be adjusted in various ways. For example, the output voltage limiting value is directly adjusted from 43V to 50V. Alternatively, the output voltage limiting value is gradually increased from 43V to 50V in a step-by-step manner. The way of adjusting the output voltage limiting value of the optimizer is not limited in the embodiment, as long as the output voltage limiting value of the optimizer can be adjusted.

In a second scheme, the power is increased by decreasing the DC bus voltage of the inverter. For example, the DC bus voltage of the inverter is decreased from 800V to 700V. In this case, the output voltage of the optimizer corresponding to the photovoltaic string with the maximum output power of 100 W is calculated as (700V−11×43V)/11=20.6V, the output voltage of the optimizer corresponding to the photovoltaic string with the maximum output power of 200 W is calculated as 20.6V×2=41.2V<43V, and thus the maximum power generation capacity of the entire optimizer set can be achieved.

In a third scheme, the first and second schemes described above are adopted at the same time.

Specifically, the control method according to the embodiment of the present disclosure may also be applied to a photovoltaic power generation system including a combiner box as shown in FIG. 4. The system includes optimizer sets, combiner boxes and an inverter. In the system, an optimizer set is formed by connecting output terminals of multiple optimizers in series. The multiple optimizer sets are connected to multiple input terminals of one combiner box. The multiple optimizer sets are connected in parallel in the combiner box. Output terminals of multiple combiner boxes are connected to DC input terminals of an inverter. The multiple combiner boxes are connected in parallel at the DC input terminal of the inverter. Bidirectional communication may be implemented between the combiner box and an optimizer corresponding to the combiner box. The bidirectional communication may be implemented through wired communication (for example, PLC and CAN communication) or wireless communication (for example, wifi and zigbee). Bidirectional communication is performed between the combiner box and the inverter. The combiner box is capable of separately detecting a current and a voltage of each connected optimizer set and an output voltage of the combiner box.

The communication host may be an external device of the photovoltaic power generation system shown in FIG. 1, and may also be a part of the inverter. The communication host may be one or more external devices of the photovoltaic power generation system shown in FIG. 4, and may also be a part of the inverter or a part of the combiner box.

Specifically, description is made through an example hereinafter.

It is assumed that in the photovoltaic power generation system shown in FIG. 4, a combiner box is connected with two optimizer sets. Each photovoltaic string in a first optimizer set has a maximum power of 200 W. In a second optimizer set, a photovoltaic string corresponding to 11 optimizers has a maximum power of 200 W, and a photovoltaic string corresponding to the other 11 optimizers has a maximum power of only 100 W due to shielding. In this case, the first optimizer set has a power generation capacity of 4400 W (that is, each of the optimizer operates in a full power state, 200 W*22), and the second optimizer set has a power generation capacity of 2692.8 W (it can be seen from the previous analysis that, since an output power of the optimizer corresponding to the photovoltaic string with a maximum power of 200 W is only 144.8 W instead of 200 W due to that the output voltage limiting value of the optimizer is 43V, the power generation capacity of the optimizer set is calculated as (144.8 W+100 W)×11=2692.8 W).

In this case, in the embodiment, it is required to adjust the second optimizer set. For example, the output voltage limiting value of the optimizer may be increased from 43V to 50V, or the DC bus voltage may be decreased from 800V to 700V.

In a case where only the output voltage limiting value of the optimizer is increased from 43V to 50V and since the output voltage of the optimizer corresponding to the photovoltaic string with the maximum output power of 100 W is 24.2V, the output voltage of the optimizer corresponding to the photovoltaic string with the maximum output power of 200 W is 48.4V, which is smaller than 50V. Therefore, the optimizer can output a power of 200 W and is not limited by the output voltage limiting value. The output power of the second optimizer set is increased from 2692.8 W to 3300 W.

In a case where only the DC bus voltage is decreased from 800V to 700V and since the maximum voltage limiting value is 43V, the output voltage of the optimizer corresponding to the photovoltaic string with the maximum output power of 200 W is 43V. In this case, the output voltage of the optimizer corresponding to a photovoltaic string with the maximum output power of 100 W is calculated as (700V−11×43V)/11=20.6V, and the output voltage of the optimizer corresponding to the photovoltaic string with a maximum output power of 200 W is calculated as 20.6V×2=41.2V, which is smaller than 43V. Therefore, the overall maximum power optimization can be achieved, and the output power of the second optimizer set is increased from 2692.8 W to 3300 W.

It can be seen that with the communication host according to the embodiment of the present disclosure, the maximum power generation capacity of the photovoltaic power generation system can be achieved.

Based on the above embodiments, a photovoltaic power generation system is further provided, which includes photovoltaic strings, optimizers and a communication host.

The photovoltaic string includes at least one photovoltaic module. The optimizer is connected in parallel with at least one of the photovoltaic strings. Output terminals of multiple optimizers are connected in series to form an optimizer set. An output terminal of the optimizer set is connected to a DC input terminal of a grid-connected inverter. The communication host includes an acquire module, a determining module and a control module.

The acquiring module is configured to acquire an operating state parameter of the photovoltaic power generation system. The operating state parameter includes at least one or more of the following parameters: an output voltage of the optimizer, an operating state of the optimizer, an input current of the grid-connected inverter and an input power of the grid-connected inverter.

The determining module is configured to determine, based on the operating state parameter, whether the optimizer meets a first preset triggering condition.

The control module is configured to:
transmit, in a case where the optimizer meets the first preset triggering condition, a first triggering instruction for decreasing a direct current bus voltage, to instruct the photovoltaic power generation system to decrease, in response to the first triggering instruction, the direct current bus voltage of the grid-connected inverter in the photovoltaic power generation system, and/or transmit, in a case where the optimizer meets the first preset triggering condition, a second triggering instruction for adjusting an output voltage limiting value of the optimizer, to instruct the photovoltaic power generation system to increase, in response to the second triggering instruction, an output voltage limiting value of at least one of the optimizers meeting the first preset triggering condition.

Optionally, the first preset triggering condition includes at least one of:
a condition that an output voltage of at least one of the optimizers is greater than or equal to a first output voltage limiting value;
a condition that at least one of the optimizers is in a power-limited operating state;
a condition that at least a difference between two input currents of the grid-connected inverter is greater than a first preset current threshold; and
a condition that at least a difference between two input powers of the grid-connected inverter is greater than or equal to a first preset power threshold.

Optionally, the photovoltaic power generation system may further include a communication module. The communication module is arranged between the communication host and the optimizer and is configured to perform data communication between the optimizer and the communication host.

Optionally, the control module is further configured to:
transmit, in a case where the optimizer meets a second preset triggering condition, a third triggering instruction for increasing a direct current bus voltage, to instruct the photovoltaic power generation system to increase, in response to the third triggering instruction, the direct current bus voltage of the grid-connected inverter in the photovoltaic power generation system, and/or transmit, in a case where the optimizer meets the second preset triggering condition, a fourth triggering instruction for adjusting the output voltage limiting value of the optimizer, to instruct the photovoltaic power generation system to decrease, in response to the fourth triggering instruction, an output voltage limiting value of at least one of the optimizers meeting the second preset triggering condition.

Optionally, the second preset triggering condition includes at least one of:
a condition that an output voltage of at least one of the optimizers is smaller than a second output voltage limiting value;
a condition that at least one of the optimizers is in a released power-limited operating state;
a condition that at least a difference between two input currents of the grid-connected inverter is less than a second preset current threshold; and
a condition that at least a difference between two input powers of the grid-connected inverter is smaller than the second preset power threshold.

For the operating principle of the photovoltaic power generation system, reference may be made to the above embodiments.

In summary, a communication host is provided according to the embodiment of the present disclosure, which is applied to a photovoltaic power generation system. The photovoltaic power generation system includes a photovoltaic string and an optimizer. The photovoltaic string includes at least one photovoltaic module. The optimizer is connected in parallel with at least one of the photovoltaic strings. Output terminals of multiple optimizers are connected in series to form an optimizer set. Output terminals of multiple optimizer sets are connected to a DC input terminal of a grid-connected inverter. The communication host includes an acquiring module, a determining module and a control module. The acquiring module is configured to acquire an operating state parameter of the photovoltaic power generation system. The determining module is configured to determine, based on the operating state parameter, whether the optimizer meets a first preset triggering condition. The control module is configured to: transmit, in a case where the optimizer meets the first preset triggering condition, a first triggering instruction for decreasing a DC bus voltage, to instruct the photovoltaic power generation system to decrease, in response to the first triggering instruction, the DC bus voltage of the grid-connected inverter in the photovoltaic power generation system; and/or transmit, in a case where the optimizer meets the first preset triggering condition, a second triggering instruction for adjusting an output voltage limiting value of the optimizer, to instruct the photovoltaic power generation system to increase, in response to the second triggering instruction, an output voltage limiting value of at least one of the optimizers meeting the first preset triggering condition. It can be seen from the solution that the DC bus voltage or the output voltage limiting value of the optimizer is adjusted, thereby achieving a maximum power generation capacity of the photovoltaic power generation system.

The embodiments in this specification are described in a progressive manner, and each embodiment focuses on a difference from other embodiments, and the same or similar parts among the embodiments may be referred to each other. Since the device disclosed in the embodiment corresponds to the method disclosed in the embodiment, the device is described simply, and for the related parts, one may refer to the description of the method.

Those skilled in the art may further realize that the units and algorithm steps of the examples described in the embodiments disclosed herein can be implemented by electronic hardware, computer software, or a combination thereof. To clearly describe interchangeability between hardware and software, the modules and steps of each example have been generally described in terms of their functionality in the above description. Whether these functions are implemented by hardware or software depends on the specific application and design constraints of the technical solutions. Those skilled in the art may use different methods to implement the described functions for each particular application, but such implementation should not be considered as going beyond the scope of the present disclosure.

The steps of the method or the algorithm described according to the embodiments disclosed herein may be implemented in forms of hardware, a software module executed by a processor or the combination thereof. The software module may be stored in a random access memory (RAM), a memory, a read-only memory (ROM), an electrically programmable ROM, an electrically erasable programmable ROM, a register, a hardware disk, a movable magnetic disk, CD-ROM or any other forms of storage medium well known in the conventional technology.

The above description of the disclosed embodiments enables those skilled in the art to implement or use the present disclosure. Various modifications to these embodiments are readily apparent to those skilled in the art, and the general principles defined herein may be implemented in other embodiments without departing from the spirit or scope of the disclosure. Therefore, the present disclosure is not limited to the embodiments shown herein, but should conform to the widest scope consistent with the principles and novel features disclosed herein.

The invention claimed is:

1. A communication host applied to a photovoltaic power generation system, wherein the photovoltaic power generation system comprises photovoltaic strings and optimizers, each of the photovoltaic strings comprises at least one photovoltaic module, each of the optimizers is connected in parallel with at least one of the photovoltaic strings, output terminals of a plurality of optimizers in the optimizers are connected in series to form an optimizer set, an output terminal of the optimizer set is connected to a direct current input terminal of a grid-connected inverter, and the communication host comprises:
an acquiring module configured to acquire an operating state parameter of the photovoltaic power generation system, wherein the operating state parameter comprises at least one or more of the following parameters: an output voltage of the optimizer, an operating state of the optimizer, an input current of the grid-connected inverter and an input power of the grid-connected inverter;
a determining module configured to determine, based on the operating state parameter, whether the optimizer meets a first preset triggering condition; and
a control module configured to perform at least one of the following operations:
transmitting, in a case where the optimizer meets the first preset triggering condition, a first triggering instruction for decreasing a direct current bus voltage, to instruct the photovoltaic power generation system to decrease, in response to the first triggering instruction, the direct current bus voltage of the grid-connected inverter in the photovoltaic power generation system, and
transmitting, in a case where the optimizer meets the first preset triggering condition, a second triggering instruction for adjusting an output voltage limiting value of the optimizer, to instruct the photovoltaic power generation system to increase, in response to the second triggering instruction, an output voltage limiting value of at least one of the optimizers meeting the first preset triggering condition.

2. The communication host according to claim 1, wherein the first preset triggering condition comprises at least one of:
a condition that an output voltage of at least one of the optimizers is greater than or equal to a first output voltage limiting value;
a condition that at least one of the optimizers is in a power-limited operating state;
a condition that at least a difference between two input currents of the grid-connected inverter is greater than a first preset current threshold; and
a condition that at least a difference between two input powers of the grid-connected inverter is greater than or equal to a first preset power threshold.

3. The communication host according to claim 1, further comprising:
a communication module arranged between the communication host and the optimizer, and configured to perform data communication between the optimizer and the communication host.

4. The communication host according to claim 1, wherein the control module is further configured to perform at least one of the following operations:
transmitting, in a case where the optimizer meets a second preset triggering condition, a third triggering instruction for increasing a direct current bus voltage, to instruct the photovoltaic power generation system to increase, in response to the third triggering instruction, the direct current bus voltage of the grid-connected inverter in the photovoltaic power generation system, and
transmitting, in a case where the optimizer meets the second preset triggering condition, a fourth triggering instruction for adjusting the output voltage limiting value of the optimizer, to instruct the photovoltaic power generation system to decrease, in response to the fourth triggering instruction, an output voltage limiting value of at least one of the optimizers meeting the second preset triggering condition.

5. The communication host according to claim 4, wherein the second preset triggering condition comprises at least one of:
a condition that an output voltage of at least one of the optimizers is smaller than a second output voltage limiting value;
a condition that at least one of the optimizers is in a released power-limited operating state;
a condition that at least a difference between two input currents of the grid-connected inverter is less than a second preset current threshold; and
a condition that at least a difference between two input powers of the grid-connected inverter is smaller than a second preset power threshold.

6. A photovoltaic power generation system, comprising photovoltaic strings, optimizers and a communication host, wherein each of the photovoltaic strings comprises at least one photovoltaic module, the optimizer is connected in parallel with at least one of the photovoltaic strings, output terminals of a plurality of optimizers in the optimizers are connected in series to form an optimizer set, an output terminal of the optimizer set is connected to a direct current input terminal of a grid-connected inverter, and the communication host comprises:

an acquiring module configured to acquire an operating state parameter of the photovoltaic power generation system, wherein the operating state parameter comprises at least one or more of the following parameters: an output voltage of the optimizer, an operating state of the optimizer, an input current of the grid-connected inverter and an input power of the grid-connected inverter;

a determining module configured to determine, based on the operating state parameter, whether the optimizer meets a first preset triggering condition; and a control module configured to perform at least one of the following operations:

transmitting, in a case where the optimizer meets the first preset triggering condition, a first triggering instruction for decreasing a direct current bus voltage, to instruct the photovoltaic power generation system to decrease, in response to the first triggering instruction, the direct current bus voltage of the grid-connected inverter in the photovoltaic power generation system, and transmitting, in a case where the optimizer meets the first preset triggering condition, a second triggering instruction for adjusting an output voltage limiting value of the optimizer, to instruct the photovoltaic power generation system to increase, in response to the second triggering instruction, an output voltage limiting value of at least one of the optimizers meeting the first preset triggering condition.

7. The photovoltaic power generation system according to claim 6, wherein the first preset triggering condition comprises at least one of:

a condition that an output voltage of at least one of the optimizers is greater than or equal to a first output voltage limiting value;

a condition that at least one of the optimizers is in a power-limited operating state;

a condition that at least a difference between two input currents of the grid-connected inverter is greater than a first preset current threshold; and a condition that at least a difference between two input powers of the grid-connected inverter is greater than or equal to a first preset power threshold.

8. The photovoltaic power generation system according to claim 6, further comprising:

a communication module arranged between the communication host and the optimizer, and configured to perform data communication between the optimizer and the communication host.

9. The photovoltaic power generation system according to claim 6, wherein the control module is further configured to perform at least one of the following operations:

transmitting, in a case where the optimizer meets a second preset triggering condition, a third triggering instruction for increasing a direct current bus voltage, to instruct the photovoltaic power generation system to increase, in response to the third triggering instruction, the direct current bus voltage of the grid-connected inverter in the photovoltaic power generation system, and transmitting, in a case where the optimizer meets the second preset triggering condition, a fourth triggering instruction for adjusting the output voltage limiting value of the optimizer, to instruct the photovoltaic power generation system to decrease, in response to the fourth triggering instruction, an output voltage limiting value of at least one of the optimizers meeting the second preset triggering condition.

10. The photovoltaic power generation system according to claim 9, wherein the second preset triggering condition comprises at least one of:

a condition that an output voltage of at least one of the optimizers is smaller than a second output voltage limiting value;

a condition that at least one of the optimizers is in a released power-limited operating state;

a condition that at least a difference between two input currents of the grid-connected inverter is less than a second preset current threshold; and a condition that at least a difference between two input powers of the grid-connected inverter is smaller than the second preset power threshold.

* * * * *

UNITED STATES PATENT AND TRADEMARK OFFICE
CERTIFICATE OF CORRECTION

PATENT NO. : 10,298,019 B1  
APPLICATION NO. : 16/108872  
DATED : May 21, 2019  
INVENTOR(S) : Xinyu Wang et al.

Page 1 of 1

It is certified that error appears in the above-identified patent and that said Letters Patent is hereby corrected as shown below:

On the Title Page

At Column 1, please delete the foreign application priority number "2017 1 014596" and insert
-- 2017 1 1014596 --.

Signed and Sealed this
First Day of October, 2019

Andrei Iancu
*Director of the United States Patent and Trademark Office*